(12) United States Patent
Tanaka et al.

(10) Patent No.: US 12,519,071 B2
(45) Date of Patent: Jan. 6, 2026

(54) STRUCTURE CONTAINING Sn LAYER OR Sn ALLOY LAYER

(71) Applicant: ISHIHARA CHEMICAL CO., LTD., Kobe (JP)

(72) Inventors: Takahiro Tanaka, Kobe (JP); Hironori Yamada, Kobe (JP); Daiki Takase, Kobe (JP); Masaru Hatabe, Kobe (JP)

(73) Assignee: ISHIHARA CHEMICAL CO., LTD., Kobe (JP)

( * ) Notice: Subject to any disclaimer, the term of this patent is extended or adjusted under 35 U.S.C. 154(b) by 0 days.

(21) Appl. No.: 17/760,278

(22) PCT Filed: Feb. 5, 2020

(86) PCT No.: PCT/JP2020/004354
§ 371 (c)(1),
(2) Date: Aug. 5, 2022

(87) PCT Pub. No.: WO2021/156970
PCT Pub. Date: Aug. 12, 2021

(65) Prior Publication Data
US 2023/0072996 A1 Mar. 9, 2023

(51) Int. Cl.
*H01L 23/00* (2006.01)
*B23K 35/26* (2006.01)
(Continued)

(52) U.S. Cl.
CPC ............ *H01L 24/05* (2013.01); *B23K 35/262* (2013.01); *B32B 15/01* (2013.01); *B32B 15/015* (2013.01);
(Continued)

(58) Field of Classification Search
CPC ......... H01L 24/05; H01L 24/08; H01L 24/13; H01L 21/50; H01L 2224/0401;
(Continued)

(56) References Cited

U.S. PATENT DOCUMENTS

| 9,082,762 B2 | 7/2015 | Kang et al. |
| 2010/0193949 A1* | 8/2010 | Belanger ................ H01L 24/05 |
| | | 257/E23.021 |

(Continued)

FOREIGN PATENT DOCUMENTS

| CN | 103531933 A | 1/2014 |
| JP | H08-130227 A | 5/1996 |
| JP | H09-074097 A | 3/1997 |

OTHER PUBLICATIONS

Office Action dated Jun. 6, 2023 for Taiwanese Patent Application No. 109103442, 7 pages.

(Continued)

*Primary Examiner* — Michael E. La Villa
(74) *Attorney, Agent, or Firm* — KNOBBE, MARTENS, OLSON & BEAR, LLP

(57) ABSTRACT

A structure includes an Sn layer or an Sn alloy layer formed above a substrate, and an under barrier metal formed between the substrate and the Sn layer or Sn alloy layer. The under barrier metal is an Ni alloy layer containing Ni, and at least one selected from W, Ir, Pt, Au, and Bi, and can sufficiently inhibit generation of an intermetallic compound through a reaction, caused due to metal diffusion of a metal contained in the substrate, between the metal and Sn contained in the Sn layer or Sn alloy layer.

5 Claims, 2 Drawing Sheets

(51) Int. Cl.
*B32B 15/01* (2006.01)
*B32B 15/04* (2006.01)
*B32B 15/20* (2006.01)
*C22C 13/00* (2006.01)
*C22C 19/00* (2006.01)
*C22C 19/03* (2006.01)
*C23C 28/02* (2006.01)
*C23C 30/00* (2006.01)
*C25D 5/12* (2006.01)
*C25D 5/50* (2006.01)
*C25D 7/12* (2006.01)
*H01L 21/50* (2006.01)

(52) U.S. Cl.
CPC ............ *B32B 15/018* (2013.01); *B32B 15/04* (2013.01); *B32B 15/043* (2013.01); *B32B 15/20* (2013.01); *C22C 13/00* (2013.01); *C22C 19/00* (2013.01); *C22C 19/03* (2013.01); *C23C 28/02* (2013.01); *C23C 28/021* (2013.01); *C23C 28/023* (2013.01); *C23C 30/00* (2013.01); *C23C 30/005* (2013.01); *C25D 5/12* (2013.01); *C25D 5/505* (2013.01); *C25D 7/12* (2013.01); *H01L 21/50* (2013.01); *H01L 24/08* (2013.01); *H01L 24/13* (2013.01); *H01L 2224/0401* (2013.01); *H01L 2224/05155* (2013.01); *H01L 2224/05163* (2013.01); *H01L 2224/05613* (2013.01); *H01L 2224/05644* (2013.01); *H01L 2224/05655* (2013.01); *H01L 2224/05669* (2013.01); *H01L 2224/05678* (2013.01); *H01L 2224/05684* (2013.01); *H01L 2224/13006* (2013.01); *H01L 2224/13109* (2013.01); *H01L 2224/13111* (2013.01); *H01L 2224/13113* (2013.01); *H01L 2224/13139* (2013.01); *H01L 2224/13147* (2013.01); *Y10T 428/12687* (2015.01); *Y10T 428/12694* (2015.01); *Y10T 428/12708* (2015.01); *Y10T 428/12715* (2015.01); *Y10T 428/12722* (2015.01); *Y10T 428/12875* (2015.01); *Y10T 428/12889* (2015.01); *Y10T 428/1291* (2015.01); *Y10T 428/12917* (2015.01); *Y10T 428/12931* (2015.01); *Y10T 428/12937* (2015.01); *Y10T 428/12944* (2015.01)

(58) Field of Classification Search
CPC . H01L 2224/05155; H01L 2224/05163; H01L 2224/05644; H01L 2224/05655; H01L 2224/05669; H01L 2224/05678; H01L 2224/05684; H01L 2224/13006; H01L 2224/13109; H01L 2224/13111; H01L 2224/13113; H01L 2224/13139; H01L 2224/13147; B23K 35/262; B32B 15/01; B32B 15/015; B32B 15/04; B32B 15/043; B32B 15/20; B32B 15/018; C22C 13/00; C22C 19/00; C22C 19/03; C25D 5/12; C25D 5/505; C25D 7/12; C23C 28/02; C23C 28/021; C23C 28/023; C23C 30/00; C23C 30/005; Y10T 428/12687; Y10T 428/12694; Y10T 428/12708; Y10T 428/12715; Y10T 428/12722; Y10T 428/1291; Y10T 428/12917; Y10T 428/12931; Y10T 428/12937; Y10T 428/12944; Y10T 428/12875; Y10T 428/12889
See application file for complete search history.

(56) References Cited

U.S. PATENT DOCUMENTS

| | | | |
|---|---|---|---|
| 2012/0091578 A1* | 4/2012 | Chen | H01L 24/06 257/737 |
| 2014/0004373 A1 | 1/2014 | Taninouchi et al. | |
| 2017/0330850 A1* | 11/2017 | Iuchi | H05K 3/34 |

OTHER PUBLICATIONS

International Search Report mailed on Apr. 28, 2020 for PCT/JP2020/004354.
Koo et al., Effects of Complexing Reagent on Electroless Nickel Iron Alloy Plating for the Diffusion Barrier of UBM, Materials Transaction, vol. 58, No. 2, pp. 148-151, 2017. (Jan.).

* cited by examiner

[FIG. 1]
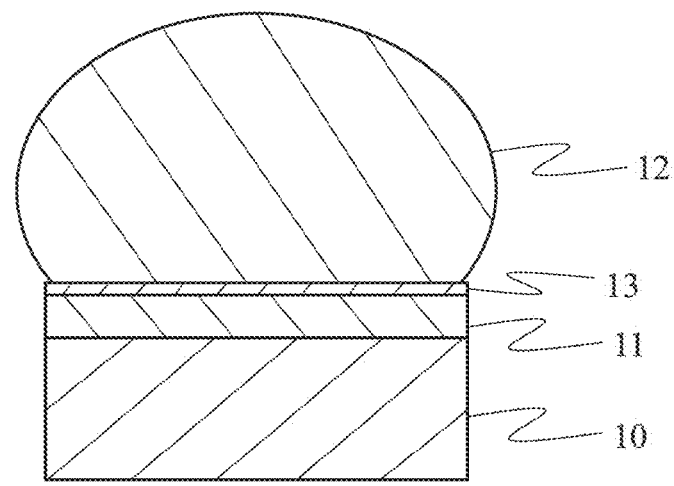

[FIG. 2]
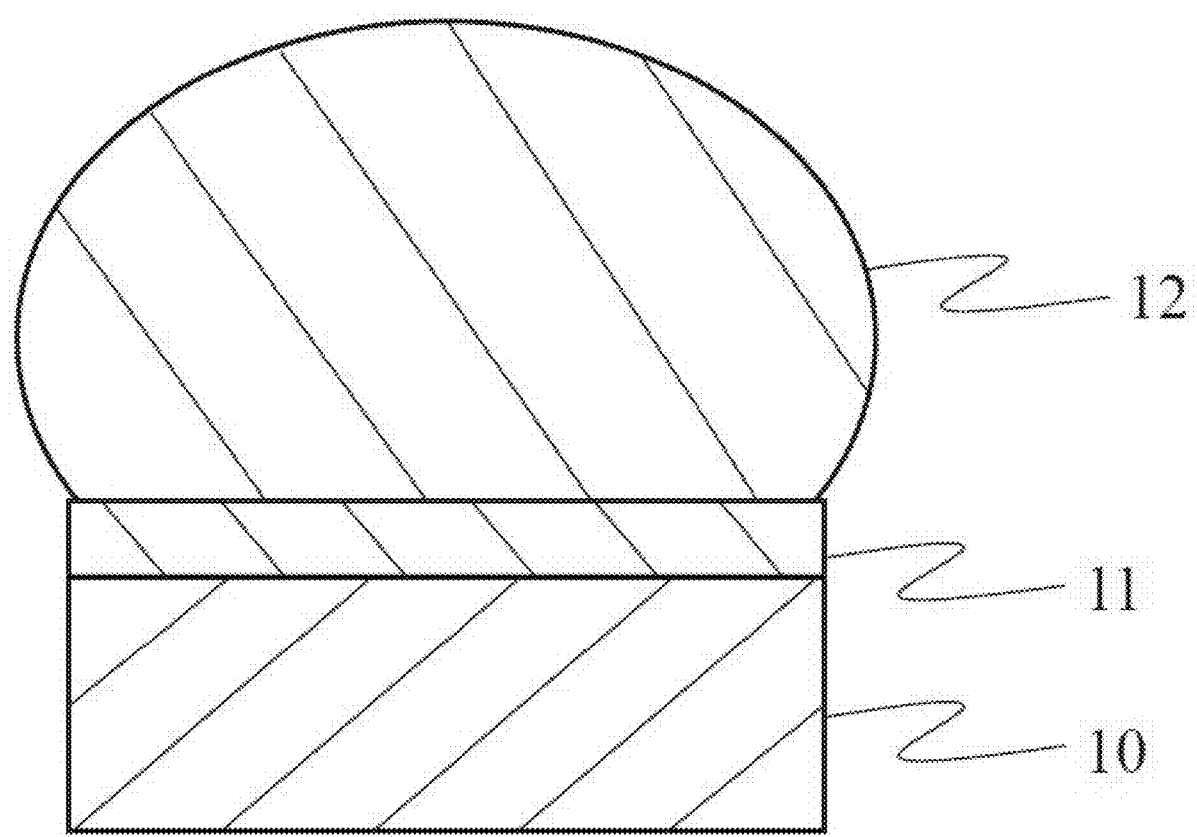

STRUCTURE CONTAINING Sn LAYER OR Sn ALLOY LAYER

PRIORITY AND CROSS REFERENCE TO RELATED APPLICATIONS

This application is the U.S. National Stage Application under 35 U.S.C. § 371 of International Application No. PCT/JP2020/004354, filed Feb. 5, 2020, designating the U.S. and published as WO 2021/156970 A1 on Aug. 12, 2021. Any and all applications for which a foreign or a domestic priority is claimed is/are identified in the Application Data Sheet filed herewith and is/are hereby incorporated by reference in their entirety under 37 C.F.R. § 1.57.

TECHNICAL FIELD

The present invention relates to a structure including an Sn layer or an Sn alloy layer, and more particularly, it relates to a structure including an Sn layer or an Sn alloy layer provided as a conductive component or a connection component of an electrode, a wiring or the like of an electronic component or the like.

BACKGROUND ART

Sn and Sn alloy have a low melting point and excellent ductility, and hence have been conventionally used as a bonding material in an electronic component or the like. In this case, Sn or Sn alloy is provided on a substrate mainly by a ball mounting method, a pasting method, a plating method, an inkjet method or the like. As the substrate, a Cu or Cu alloy-based substrate, an Ni alloy-based substrate or the like is used, or when another non-metal substrate is used, a Cu layer or an Ni layer is generally formed on the substrate by plating, sputtering or the like. In a well-known structure for, for example, a flip chip bump or the like, an Ni plating layer of about several μm is provided on a Cu sputtered layer used as a substrate, and a plating layer of Sn or Sn-based alloy is further provided thereon. The Ni plating layer provided on the substrate is usually designated as an under barrier metal (hereinafter, also referred to as "UBM"), and one purpose of providing the UBM is to inhibit generation of an intermetallic compound between Cu and Sn or Sn-based alloy due to metal diffusion.

Even when a UBM of an Ni plating layer is provided, however, a proportion of an intermetallic compound in a connecting portion between a Cu substrate or a Cu sputtered layer provided on a substrate and an Sn layer or an Sn-based alloy layer is increased due to recent miniaturization of an electronic circuit, which causes a problem of deterioration of electric characteristics and connection reliability. In order to solve this problem, studies have been made for reducing a generation amount of an intermetallic compound by providing, as a UBM, a Co plating layer or an Ni—Fe alloy plating layer below an Sn layer or an Sn alloy layer (see, for example, Patent Literature 1, Non-Patent Literature 1 or the like).

CITATION LIST

Patent Literature

[Patent Literature 1] U.S. Pat. No. 9,082,762

Non-Patent Literature

[Non-Patent Literature 1] Ja-Kyung Koo and Jae-Ho Lee, Materials Transactions, Vol. 58 (2017), No. 2, p. 148-151

SUMMARY OF INVENTION

Technical Problem

When a UBM disclosed in Patent Literature 1 or Non-Patent Literature 1 is employed, a prescribed effect can be obtained, but it is difficult to sufficiently inhibit generation of an intermetallic compound in using a Co plating layer or an Ni—Fe alloy plating layer under more severe conditions, and there is a demand for a UBM having a new composition.

The present invention was devised in consideration of the above-described problem, and an object thereof is to obtain a UBM capable of further inhibiting generation of an intermetallic compound between a substrate containing a metal and an Sn layer or an Sn alloy layer.

Solution to Problem

In order to achieve the above-described object, the present inventors have found, as a result of earnest studies, that generation of an intermetallic compound can be remarkably inhibited in a structure including an Sn layer or an Sn alloy layer by using an Ni alloy layer as a UBM, which contains: Ni; and at least one selected from W, Ir, Pt, Au, and Bi, and thus, the present invention was accomplished.

Specifically, the structure including an Sn layer or an Sn alloy layer according to the present invention includes: a substrate; the Sn layer or the Sn alloy layer formed above the substrate; and an under barrier metal formed between the substrate and the Sn layer or the Sn alloy layer, and the under barrier metal is an Ni alloy layer containing: Ni; and at least one selected from W, Ir, Pt, Au, and Bi.

According to the structure including an Sn layer or an Sn alloy layer of the present invention, the Ni alloy layer as the under barrier metal, which contains: Ni; and at least one selected from W, Ir, Pt, Au, and Bi, is formed between the substrate and the Sn layer or the Sn alloy layer. As a result, generation of an intermetallic compound through a reaction, caused due to metal diffusion of a metal contained in the substrate, between the metal and Sn contained in the Sn layer or the Sn alloy layer can be inhibited by the under barrier metal. Accordingly, the structure has good electric characteristics and connection reliability, and is suitably used in an electronic component or the like.

As described above, the under barrier metal is the Ni alloy layer containing: Ni; and at least one selected from W, Ir, Pt, Au, and Bi. In this case, the Ni alloy layer preferably contains Ni—W alloy, Ni—Ir alloy, Ni—Pt alloy, Ni—Au alloy, or Ni—Bi alloy.

As described above furthermore, when the under barrier metal is the Ni alloy layer containing Ni—W alloy, Ni—Ir alloy, Ni—Pt alloy, Ni—Au alloy, or Ni—Bi alloy, the Ni alloy layer preferably contains W, Ir, Pt, Au, or Bi in a mass ratio of 50% or less.

In this manner, ability of the under barrier metal to inhibit generation of an intermetallic compound can be further improved.

Advantageous Effects of Invention

According to a structure including an Sn layer or an Sn alloy layer of the present invention, generation of an intermetallic compound through a reaction, caused due to metal diffusion of a metal contained in a substrate, between the metal and Sn contained in the Sn layer or the Sn alloy layer can be sufficiently inhibited. Accordingly, the structure has good electric characteristics and connection reliability, and is suitably used in an electronic component or the like.

BRIEF DESCRIPTION OF THE DRAWINGS

FIG. 1 is a diagram illustrating a structure including an Sn layer or an Sn alloy layer according to one embodiment of the present invention.

FIG. 2 is a diagram illustrating a structure including an Sn layer or an Sn alloy layer according to an embodiment of the present invention in which no intermetallic is formed through reaction caused due to metal diffusion of a metal contained in the substrate.

DETAILED DESCRIPTION

An embodiment for practicing the present invention will now be described with reference to the accompanying drawing. The description of a preferable embodiment given below is substantially illustrative and is not intended to limit the present invention, and an application method or use thereof.

A structure including an Sn layer or an Sn alloy layer according to one embodiment of the present invention will be described with reference to FIG. 1.

As illustrated in FIG. 1, in the structure of the present embodiment, an under barrier metal (UBM) 11 is formed on a substrate 10, and an Sn layer 12 is formed on the UBM 11. The substrate 10 is not especially limited, and can be, for example, a metal substrate of Cu, Ni or the like, a glass substrate, a silicon substrate or a sapphire substrate, an organic material substrate or the like. When it is not a metal substrate, however, a metal thin film of Cu or Ni or an alloy containing any of these is formed by plating or sputtering on the top surface thereof, and a structure in the shape of a projection containing Cu or Ni, or an alloy containing any of these is further formed thereon in some cases. Herein, the substrate including such a metal thin film and such a structure formed on the top surface thereof is inclusively designated as the substrate 10. Besides, the substrate 10 is not limited to a plate-shaped substrate, but may be a bar material in the shape of, for example, a bar or a line. The Sn layer 12 is made of a single metal of Sn, or an Sn alloy containing Sn. In particular, examples of the Sn alloy include, but are not limited to, Sn—Ag, Sn—Ag—Cu, Sn—Cu, Sn—Bi and Sn—In. The Sn layer 12 is formed by, for example, a ball mounting method, a pasting method, a plating method or an inkjet method, but the formation method is not limited to these.

When the Sn layer 12 is formed by an electroplating method, an Sn plating solution to be used basically contains a soluble stannous salt, an acid or a salt thereof used as a solution base, and if necessary, various additives such as an antioxidant, a stabilizer, a complexing agent, a surfactant, a brightener, a smoothing agent, a pH adjusting agent, a conductive salt and a preservative. Besides, as the soluble stannous salt, for example, any of stannous salts of organic sulfonic acids such as methanesulfonic acid, ethanesulfonic acid, 2-propanolsulfonic acid, sulfosuccinic acid and p-phenolsulfonic acid, stannous borofluoride, stannous sulfate, stannous oxide, stannous chloride, sodium stannate, potassium stannate and the like can be used. Besides, when the Sn layer 12 contains an Sn alloy, an Sn ally film may be formed by using a plating solution containing, for example, an Sn salt and another metal salt of Ag, Cu or the like, or an alloy film may be formed by laminating an Sn plating film and another metal film of Ag, Cu or the like, and melting the resultant by a heat treatment.

The antioxidant prevents oxidation of $Sn^{2+}$ in a bath, and can be, for example, hypophosphorous acid or a salt thereof, ascorbic acid or a salt thereof, hydroquinone, catechol, resorcin, fluoroglucin, cresol sulfonic acid or a salt thereof, phenol sulfonic acid or a salt thereof, catechol sulfonic acid or a salt thereof, hydroquinone sulfonic acid or a salt thereof, hydrazine or the like.

The stabilizer stabilizes a plating bath to prevent its decomposition, and can be, any of known stabilizers including a sulfur-containing compound such as a cyanide compound, a thiourea, thiosulfate, sulfite or acetylcysteine, and an oxycarboxylic acid such as citric acid.

The complexing agent is contained for stabilizing $Sn^{2+}$ in a neutral region to prevent generation of white precipitation or decomposition of the bath, and can be, for example, oxycarboxylic acid, polycarboxylic acid, monocarboxylic acid or the like, and specifically, gluconic acid, citric acid, glucoheptonic acid, gluconolactone, glucoheptolactone, formic acid, acetic acid, propionic acid, butyric acid, ascorbic acid, oxalic acid, malonic acid, citric acid, glycolic acid, malic acid, tartaric acid, diglycolic acid or a salt of any of these, or the like can be used. In particular, gluconic acid, citric acid, glucoheptonic acid, gluconolactone, glucoheptolactone or a salt of any of these is preferred. Besides, ethylenediamine, ethylenediaminetetraacetic acid (EDTA), diethylenetriaminepentaacetic acid (DTPA), nitrilotriacetic acid (NTA), iminodiacetic acid (IDA), iminodipropionic acid (IDP), hydroxyethylethylenediaminetriacetic acid (HEDTA), triethylenetetraminehexaacetic acid (TTHA), ethylene dioxybis(ethylamine)-N,N,N',N'-tetraacetic acid, a glycine, nitrilotrimethylphosphonic acid, 1-hydroxyethane-1,1-diphosphonic acid, or a salt of any of these can be used.

The surfactant makes contribution to improvement of the appearance, the compactness, the smoothness, the adhesiveness and the like of a plating film, and any of usual nonionic, anionic, amphoteric or cationic surfactants can be used. As the anionic surfactant, alkyl sulfate, polyoxyethylene alkyl ether sulfate, polyoxyethylene alkyl phenyl ether sulfate, alkyl benzenesulfonate, alkyl naphthalenesulfonate or the like can be used. Examples of the cationic surfactant include mono-, di- and trialkyl amine salts, dimethyldialkyl ammonium salt and trimethylalkyl ammonium salt. As the nonionic surfactant, those obtained by addition condensation of 2 to 300 mol of ethylene oxide (EO) and/or propylene oxide (PO) with $C_1$ to $C_{20}$ alkanol, phenol, naphthol, a bisphenol, $C_1$ to $C_{25}$ alkylphenol, arylalkylphenol, $C_1$ to $C_{25}$ alkylnaphthol, $C_1$ to $C_{25}$ alkoxyl phosphoric acid (salt), sorbitan ester, polyalkylene glycol, $C_1$ to $C_{22}$ fatty amide or the like can be used. As the amphoteric surfactant, carboxybetaine, sulfobetaine, imidazolinebetaine, aminocarboxylic acid or the like can be used.

The brightener or a semi-brightener can be, for example, any of various aldehydes such as benzaldehyde, o-chlorobenzaldehyde, 2,4,6-trichlorobenzaldehyde, m-chlorobenzaldehyde, p-nitrobenzaldehyde, p-hydroxybenzaldehyde, furfural, 1-naphthaldehyde, 2-naphthaldehyde, 2-hydroxy-1-naphthaldehyde, 3-acenaphthaldehyde, benzylidene acetone, pyrididene acetone, furfurylidene acetone, cinnamaldehyde, anisaldehyde, salicylaldehyde, crotonaldehyde, acrolein, glutaraldehyde, paraldehyde and vanillin, triazine, imidazole, indole, quinoline, 2-vinylpyridine, aniline, phenanthroline, neocuproine, picolinic acid, thioureas, N-(3- hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate, or any of benzothiazoles such as benzothiazole, 2-methylbenzothiazole, 2-mercaptobenzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole and 5-hydroxy-2-methylbenzothiazole.

Examples of the smoothing agent, some of which are the same as those described as the brightener above, include β-naphthol, β-naphthol-6-sulfonic acid, β-naphthalenesulfonic acid, m-chlorobenzaldehyde, p-nitrobenzaldehyde, p-hydroxybenzaldehyde, (o- or p-) methoxybenzaldehyde, vanillin, (2,4- or 2,6-)dichlorobenzaldehyde, (o- or p-) chlorobenzaldehyde, 1-naphthaldehyde, 2-naphthaldehyde, 2(4)-hydroxy-1-naphthaladehyde, 2(4)-chloro-1-naphthaldehyde, 2(3)-thiophene carboxaldehyde, 2(3)-furaldehyde, 3-indolecarboxaldehyde, salicylaldehyde, o-phthalaldehyde, formaldehyde, acetaldehyde, paraldehyde, butyraldehyde, isobutyraldehyde, propionaldehyde, n-valeraldehyde, acrolein, crotonaldehyde, glyoxal, aldol, succindialdehyde, capronaldehyde, isovaleraldehyde, allyl aldehyde, glutaraldehyde, 1-benzylidene-7-heptanal, 2,4-hexadienal, cinnamaldehyde, benzyl crotonaldehyde, an amine-aldehyde condensate, mesityl oxide, isophorone, diacetyl, 3,4-hexandion, acetylacetone, 3-chlorobenzylideneacetone, sub. pyridylidene acetone, sub. furfurylidine acetone, sub. tenylidene acetone, 4-(1-naphthyl)-3-buten-2-one, 4-(2-furyl)-3-buten-2-one, 4-(2-thiophenyl)-3-buten-2-one, curcumin, benzylidene acetylacetone, benzalacetone, acetophenone, (2,4- or 3,4-)dichloroacetophenone, benzylidene acetophenone, 2-cinnamylthiophene, 2-(ω-benzoyl) vinylfuran, vinyl phenyl ketone, acrylic acid, methacrylic acid, ethacrylic acid, ethyl acrylate, methyl methacrylate, butyl methacrylate, crotonic acid, propylene-1,3-dicarboxylic acid, cinnamic acid, (o-, m-, or p-) toluidine, (o- or p-)aminoaniline, aniline, (o- or p-) chloroaniline, (2,5- or 3,4-) chloromethyl aniline, N-monomethyl aniline, 4,4'-diaminodiphenylmethane, N-phenyl-(α- or β-) naphthylamine, methylbenzotriazole, 1,2,3-triazine, 1,2,4-triazine, 1,3,5-triazine, 1,2,3-benzotriazole, imidazole, 2-vinylpyridine, indole, quinoline, a reaction product of monoethanolamine and o-vanillin, polyvinyl alcohol, catechol, hydroquinone, resorcin, polyethyleneimine, disodium ethylenediaminetetraacetate, and polyvinyl pyrrolidone. Besides, gelatin, polypeptone, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate, and benzothiazoles are effectively used as the smoothing agent. Examples of the benzothiazoles include benzothiazole, 2-methylbenzothiazole, 2-mercaptobenzothiazole, 2-(methylmercapto)benzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, 6-nitro-2-mercaptobenzothiazole, 5-hydroxy-2-methylbenzothiazole and 2-benzothiazole thioacetic acid.

As the pH adjusting agent, any of various acids such as hydrochloric acid and sulfuric acid, and various bases such as ammonia water, potassium hydroxide and sodium hydroxide can be used, and besides, monocarboxylic acids such as formic acid, acetic acid and propionic acid, boric acids, phosphoric acids, dicarboxylic acids such as oxalic acid and citric acid, and oxycarboxylic acids such as butyric acid and tartaric acid can be used.

As the conductive salt, any of sodium salts, potassium salts, magnesium salts, ammonium salts, amine salts and the like of sulfuric acid, hydrochloric acid, phosphoric acid, sulfamic acid, sulfonic acid and the like can be used, and it is noted that the above-described pH adjusting agent can be used also as the conductive salt in some cases.

As the preservative, boric acid, 5-chloro-2-methyl-4-isothiazolin-3-one, benzalkonium chloride, phenol, phenol polyethoxylate, thymol, resorcin, isopropylamine, guaiacol and the like can be used.

The UBM 11 is provided for inhibiting generation of an intermetallic compound 13 otherwise formed through a reaction, caused due to metal diffusion of a metal contained in the substrate 10, between the metal and Sn contained in the Sn layer 12. FIG. 2 shows an embodiment of the invention where this reaction has not occurred.

The UBM 11 is the Ni alloy layer containing: Ni; and at least one selected from W, Ir, Pt, Au, and Bi. In the present embodiment, examples of the Ni alloy layer include:

an Ni alloy layer containing: Ni; and W, Ir, Pt, Au, or Bi, i.e., an Ni alloy layer containing Ni—W alloy, Ni—Ir alloy, Ni—Pt alloy, Ni—Au alloy, or Ni—Bi alloy; and an Ni alloy layer containing: Ni; and at least two selected from W, Ir, Pt, Au, and Bi, such as an Ni alloy layer containing Ni—Au—Bi alloy, Ni—Au—Pt alloy, Ni—Au—Ir alloy, Ni—Au—W alloy, Ni—Pt—Ir alloy, Ni—Pt—W alloy, Ni—Pt—Bi alloy, Ni—Ir—W alloy, Ni—Ir—Bi alloy, or Ni—W—Bi alloy. Among them, the Ni alloy layer containing Ni—W alloy, Ni—Ir alloy, Ni—Pt alloy, Ni—Au alloy, or Ni—Bi alloy is more preferable because effect of inhibiting generation of the intermetallic compound 13 is large.

When the UBM 11 is the Ni alloy layer containing Ni—W alloy, Ni—Ir alloy, Ni—Pt alloy, Ni—Au alloy, or Ni—Bi alloy, the Ni alloy layer contains W, Ir, Pt, Au, or Bi in a mass ratio of preferably 50% or less, more preferably 35% or less, particularly 25% or less. By using such Ni alloy layer as the UBM 11, the effect of inhibiting generation of the intermetallic compound 13 can be more improved. The mass ratio of W, Ir, Pt, Au, or Bi in the Ni alloy layer containing Ni—W alloy, Ni—Ir alloy, Ni—Pt alloy, Ni—Au alloy, or Ni—Bi alloy is preferably 1% or more, more preferably 3% or more. When the mass ratio of W, Ir, Pt, Au, or Bi is less than the above lower limit, there is a possibility that the effect of inhibiting generation of the intermetallic compound 13 is not sufficiently exhibited.

Also, when the UBM 11 is the Ni alloy layer containing: Ni; and at least two selected from W, Ir, Pt, Au, and Bi, the Ni alloy layer contains at least two selected from W, Ir, Pt, Au, and Bi in the mass ratio of preferably 50% or less, more preferably 35% or less, particularly 25% or less, and in the mass ratio of preferably 1% or more, more preferably 3% or more.

The UBM 11 can be formed by a method of, for example, plating, sputtering, deposition, ball mounting, paste printing or the like. For example, when the UBM 11 is formed by electroplating, as a plating solution, can be used a solution containing: a water-soluble Ni salt; and at least one selected from a water-soluble W salt, a water-soluble Ir salt, a water-soluble Pt salt, a water-soluble Au salt, and a water-soluble Bi salt dissolved therein, and appropriately containing an acid or a salt thereof as a solution base, and if necessary, any of the above-described various additives such as the antioxidant, the stabilizer, the complexing agent, the surfactant, the brightener, the smoothing agent, the pH adjusting agent, the conductive salt and the preservative.

In the structure of the present embodiment employing the UBM 11 having the above-described composition, although the intermetallic compound 13 is generated as illustrated in FIG. 1, a thickness can be extremely reduced as compared with that in a conventional structure.

The structure of the present embodiment is applicable to electronic components such as a printed wiring board, a semiconductor integrated circuit, a resistor, a capacitor, a filter, a thermistor, a crystal oscillator, a switch, a lead wire and a solar cell, but the application is not limited to these.

EXAMPLES

Examples will now be described for describing, in detail, the structure including an Sn layer or an Sn alloy layer according to the present invention.

In these examples, a thickness of an intermetallic compound generated in each of a structure including the above-described UBM and including an Sn layer or an Sn alloy layer (Examples 1 to 12) and a structure including a conventional UBM different from the above-described UBM and including an Sn layer or an Sn alloy layer (Comparative Examples 1 to 5) was measured for comparison.

Specifically, in each of Examples 1 to 12 and Comparative Examples 1 to 5, a substrate was obtained by forming a copper plating layer on a top surface of a semiconductor wafer, and on the substrate, a UBM, and an Sn layer or an Sn alloy layer were successively formed by the electroplating. The electroplating was performed by a usual known method and a plating solution was used. In Examples 1 to 12, the plating solution was a solution in which were dissolved: a water-soluble Ni salt; and at least one selected from a water-soluble W salt, a water-soluble Ir salt, a water-soluble Pt salt, a water-soluble Au salt, and a water-soluble Bi salt in accordance with the type of a plating film to be formed, and in which were contained any of various additives. In Comparative Examples 1 to 5, the plating solution was a solution in which were dissolved: a water-soluble Ni salt; a water-soluble Ni salt and a water-soluble Fe salt; a water-soluble Au salt; or a water-soluble Bi salt in accordance with the type of a plating film to be formed, and in which were contained any of various additives. Besides, plating conditions of 50° C. and 2A/dm² were employed, and a thickness of each plating film was set to 3 µm.

Compositions of the UBM and the Sn layer or the Sn alloy layer formed in each of the examples and comparative examples are shown in Table 1 below. It is noted that a numerical value shown in each column of the UBM in Table 1 indicates a mass ratio. For example, "Ni90Au10" indicates an alloy containing 90% by mass of Ni and 10% by mass of Au.

Each of the structures of Examples 1 to 12 and Comparative Examples 1 to 5 was subjected to a heat treatment at 180° C. for 150 hours, and a thickness of an intermetallic compound generated under the Sn layer or the Sn alloy layer was measured thereafter. The results are shown in Table 1. It is noted that the thickness of the intermetallic compound in Examples 1 to 12 and Comparative Examples 2 to 5 is shown as a ratio calculated with the result of Comparative Example 1 used as a reference (100%).

TABLE 1

| | UBM | Sn layer or Sn alloy layer | Thickness (%) of intermetallic compound after heat treatment at 180° C. for 150 hours |
|---|---|---|---|
| Ex. 1 | Ni90Au10 | Sn—Ag—Cu | 88.1 |
| Ex. 2 | Ni95Au5 | Sn—Ag | 67.6 |
| Ex. 3 | Ni80Bi20 | Sn | 61.2 |
| Ex. 4 | Ni95Bi5 | Sn—Ag | 51.8 |
| Ex. 5 | Ni80W20 | Sn—Bi | 58.6 |
| Ex. 6 | Ni90W10 | Sn | 55.7 |
| Ex. 7 | Ni90Ir10 | Sn—Cu | 62.9 |
| Ex. 8 | Ni90Pt10 | Sn—Bi | 66.1 |
| Ex. 9 | Ni90Au2Bi8 | Sn—Ag | 68.2 |
| Ex. 10 | Ni80W10Bi10 | Sn—Ag | 67.2 |
| Ex. 11 | Ni75Pt5Bi20 | Sn | 69.7 |
| Ex. 12 | Ni90W5Au5 | Sn | 68.3 |
| Com. Ex. 1 | Ni | Sn—Ag | 100 |
| Com. Ex. 2 | Ni30Fe70 | Sn—Ag | 189.1 |
| Com. Ex. 3 | Ni42Fe58 | Sn | 126.8 |
| Com. Ex. 4 | Au | Sn | 110.5 |
| Com. Ex. 5 | Bi | Sn—Ag | 120.8 |

As shown in Table 1, as compared with the case where an Ni layer was used as the UBM as in a conventional UBM and an Sn—Ag alloy layer was formed thereon (Comparative Example 1), when an Ni—Fe alloy layer was used as the UBM, the thickness of the generated intermetallic compound was larger than in Comparative Example 1 even if an Sn—Ag layer (Comparative Example 2) or an Sn layer (Comparative Example 3) was formed thereon.

Also, even if an Au layer not containing Ni was used as the UBM and an Sn layer was formed thereon (Comparative Example 4), or a Bi layer not containing Ni was used as the UBM and an Sn—Ag layer was formed thereon (Comparative Example 5), the thickness of the generated intermetallic compound was larger than in Comparative Example 1.

On the other hand, when as the UBM, was used the Ni alloy layer containing: Ni; and at least one selected from W, Ir, Pt, Au, and Bi (Examples 1 to 12), the thickness of the generated intermetallic compound was smaller than in Comparative Example 1 even if an Sn layer or an Sn alloy layer was formed thereon. In other words, it is revealed that when as the UBM, is used such an Ni alloy layer containing: Ni; and at least one selected from W, Ir, Pt, Au, and Bi, generation of an intermetallic compound can be sufficiently inhibited in comparison to use of the conventional UBM.

INDUSTRIAL APPLICABILITY

The structure including an Sn layer or an Sn alloy layer according to the present invention can sufficiently inhibit generation of an intermetallic compound through a reaction, caused due to metal diffusion of a metal contained in a substrate, between the metal and Sn contained in the Sn layer or the Sn alloy layer. Therefore, the structure according to the present invention has good electric characteristics and connection reliability, and is suitably used in an electronic component or the like.

DESCRIPTION OF REFERENCE CHARACTERS

10 Substrate
11 Under barrier metal (UBM)
12 Sn layer (or Sn alloy layer)
13 Intermetallic compound

What is claimed is:

1. A structure including an Sn layer or an Sn alloy layer, comprising:
   a substrate;
   the Sn layer or the Sn alloy layer formed above the substrate; and
   an under barrier single layer formed between the substrate and the Sn layer or the Sn alloy layer, wherein:
      the Sn layer or the Sn alloy layer is a surface layer of the structure,
      the under barrier single layer is formed on a surface of the substrate that is a bottom layer of the structure,
      the under barrier single layer and the Sn layer or the Sn alloy layer are successively formed, and
      the under barrier single layer is an Ni alloy single layer consisting of:
         Ni and at least one selected from the group consisting of W, Ir, Pt, Au, and Bi,
   wherein the substrate has an exposed lower surface and is either a metal substrate of Cu or Ni or is a non-metal substrate comprising a metal thin film of Cu or Ni or an alloy of Cu or Ni on a top surface of the non-metal substrate, and
   wherein the under barrier single layer is directly formed either on the top surface of the metal substrate or on a top surface of the metal thin film on the non-metal substrate and the Sn layer or the Sn alloy layer is directly formed on the under barrier single layer, such that when the structure is subjected to a heat treatment at 180° C. for 150 hours, a thickness of an intermetallic compound generated under the Sn layer or the Sn alloy layer is 88.1% or less of the thickness of an intermetallic compound generated for an otherwise identical structure having a Sn—Ag alloy layer as the surface layer and in which the under barrier single layer is formed of Ni alone, wherein the Ni alloy single layer has 75% to 95% Ni by mass.

2. The structure including an Sn layer or an Sn alloy layer according to claim 1, wherein the Ni alloy single layer consists of Ni—W alloy, Ni—Ir alloy, Ni—Pt alloy, Ni—Au alloy, or Ni—Bi alloy.

3. The structure of claim 1, wherein the Ni alloy single layer has 2-10% Au by mass, 5-20% Bi by mass, 5-20% W by mass, 10% Ir by mass, or 5-10% Pt by mass.

4. The structure of claim 1, including an Sn layer as the surface layer.

5. The structure of claim 1, including an Sn alloy layer as the surface layer which alloy is selected from the group consisting of Sn—Ag—Cu, Sn—Ag, Sn—Bi, and Sn—Cu.

* * * * *